United States Patent [19]

Rhodes et al.

[11] Patent Number: 5,194,753

[45] Date of Patent: Mar. 16, 1993

[54] METHOD OF PREVENTING STORAGE NODE TO STORAGE NODE SHORTS IN FABRICATION OF MEMORY INTEGRATED CIRCUITRY HAVING STACKED CAPACITORS AND STACKED CAPACITOR MEMORY INTEGRATED CIRCUITS

[75] Inventors: Howard E. Rhodes; Tyler A. Lowrey, both of Boise, Id.

[73] Assignee: Micron Technology, Inc., Boise, Id.

[21] Appl. No.: 849,774

[22] Filed: Mar. 11, 1992

Related U.S. Application Data

[62] Division of Ser. No. 795,338, Nov. 19, 1991, Pat. No. 5,149,668.

[51] Int. Cl.⁵ .................. H01L 29/44; H01L 29/78
[52] U.S. Cl. ........................... 257/775; 257/296; 365/149
[58] Field of Search .................. 357/23.6; 365/149; 257/775

[56] References Cited

U.S. PATENT DOCUMENTS

5,014,103   5/1991   Ema .................................. 357/23.6

*Primary Examiner*—Jerome Jackson
*Attorney, Agent, or Firm*—Wells, St. John, Roberts, Gregory & Matkin

[57] ABSTRACT

Disclosed is a semiconductor processing method of fabricating memory integrated circuitry. Word lines are defined. Alternating first and second separation regions therebetween are defined. Storage node capacitors are formed in the first regions. The width of the first separation regions is greater than the width of the second separation regions. An insulating layer is provided to a first selected thickness which is greater than one-half the width of the second separation regions to fill the second separation regions between with insulating material. The first selected thickness is also less than one-half the width of the first separation regions to provide a space within the first separation regions. Buried contacts are etched through the insulating layer. A layer of conductive material is deposited and patterned to define lower storage node capacitor plates. A capacitor dielectric and upper storage node capacitor plates above the lower storage node capacitor plates are provided.

18 Claims, 5 Drawing Sheets

METHOD OF PREVENTING STORAGE NODE TO STORAGE NODE SHORTS IN FABRICATION OF MEMORY INTEGRATED CIRCUITRY HAVING STACKED CAPACITORS AND STACKED CAPACITOR MEMORY INTEGRATED CIRCUITS

Related Patent Data

This patent resulted from a divisional application of U.S. patent application Ser. No. 07/795,338 filed Nov. 19, 1991 "Method of Preventing Storage Node to Storage Node Shorts in Fabrication of Memory Integrated Circuitry Having Stacked Capacitors and Stacked Capacitor Memory Integrated Circuits", which is now U.S. Pat. No. 5,149,668.

TECHNICAL FIELD

This invention relates generally to fabrication of memory integrated circuitry, and more particularly to methods of preventing storage node to storage node shorts in memory integrated circuitry.

BACKGROUND OF THE INVENTION

A critical problem for advanced stacked memory circuitry, and particularly DRAM circuitry, is storage node to storage node shorts. The storage node is a conductor, typically comprised of conductively doped polysilicon. Due to the topography that is intentionally created in forming a stacked capacitor for maximizing cell capacitance, topographical canyons are created which can fill with storage node polysilicon. Even with extensive over-etching of the polysilicon, a residual polysilicon filament (stringer) can remain in such canyons which electrically connects (shorts) adjacent storage nodes. The problem will be more easily understood with reference to FIGS. 1-5.

Figure 1:
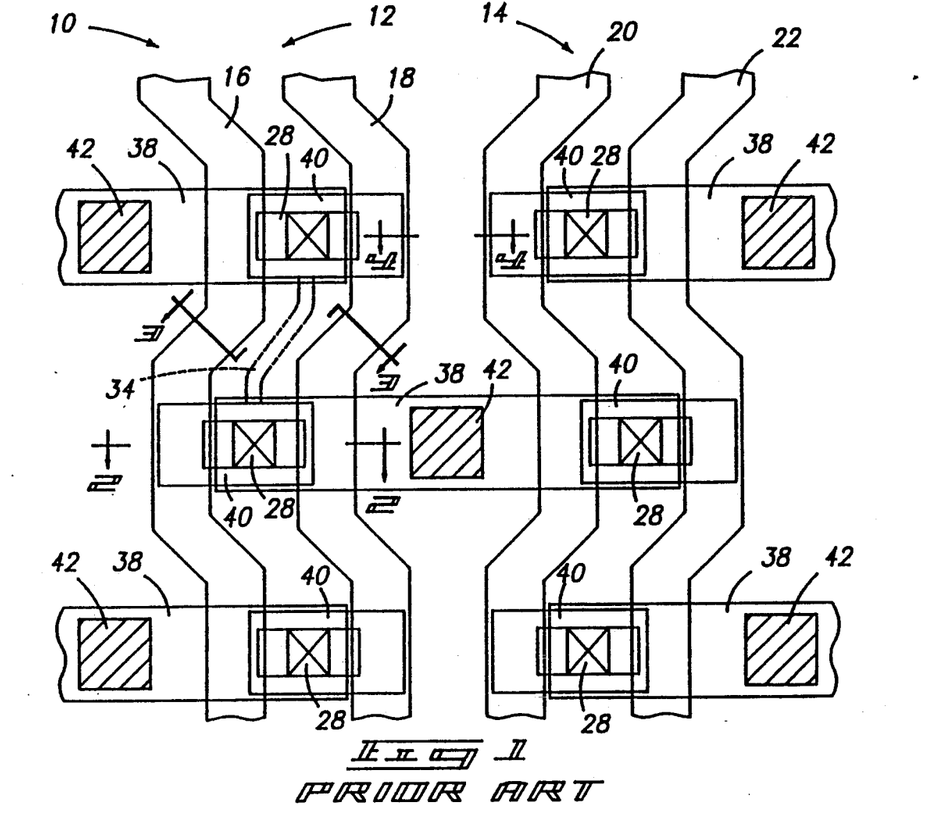
FIG. 1 is a plan view of a prior art semiconductor wafer, and is discussed in the "Background" section above.
Figure 2:
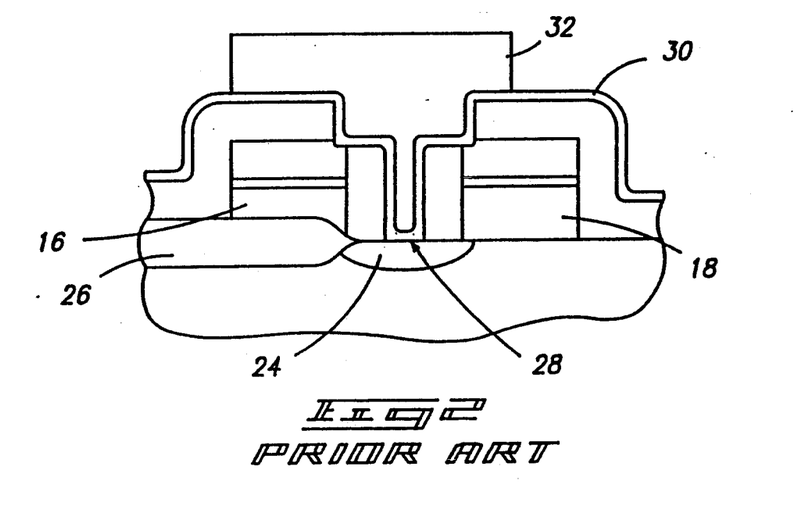
FIG. 2 is a cross sectional view of the FIG. 1 wafer taken through line 2—2 in FIG. 1.
Figure 3:
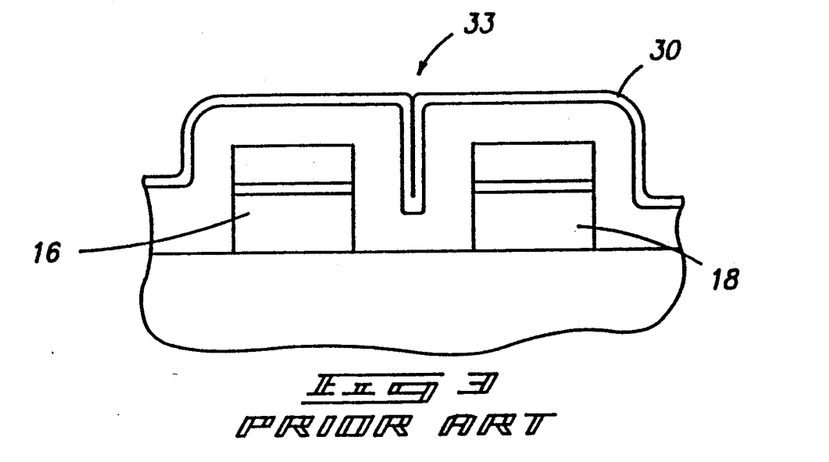
FIG. 3 is a cross sectional view of the FIG. 1 wafer taken through line 3—3 in FIG. 1.
Figure 4:
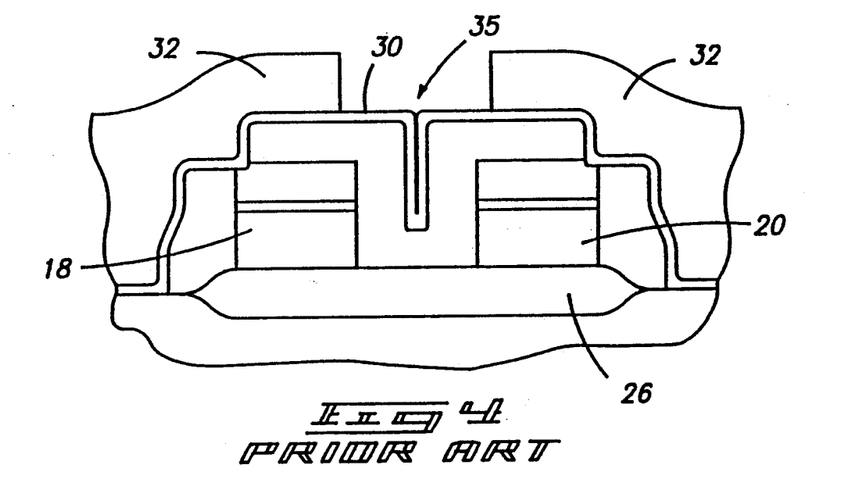
FIG. 4 is a cross sectional view of the FIG. 1 wafer taken through line 4—4 in FIG. 1.

FIG. 1 is a top plan view illustrating a semiconductor wafer fragment 10 comprised in part of two pairs of mirror image word lines 12, 14. Word line pair 12 includes individual word lines 16, 18, while word line pair 14 includes individual word lines 20, 22. FIGS. 2, 3 and 4 depict the various sections through lines 2—2, 3—3 and 4—4 respectively, in FIG. 1. Wafer fragment 10 comprises active regions 38. As well, outlines 40 for capacitors to be formed which overlap adjacent pairs of word lines are illustrated. Outlines 42 are shown for subsequent bit line contacts. Bit lines are not shown for sake of clarity with respect to the capacitor constructions. Also illustrated are buried contact outlines 28. FIGS. 2, 3 and 4 illustrate storage polysilicon 30 deposition, as well as patterning of a photoresist layer 32 used to define lower capacitor storage node plates.

The large vertical topography created by forming the stacked storage polysilicon node over the word lines is clearly evident in the FIG. 2 cross-section. FIGS. 3 and 4 show regions of the device at the same point in the process, i.e. just prior to lower capacitor plate polysilicon etch. These regions are located between the storage nodes, and are locations where all storage node polysilicon needs to be removed during lower capacitor plate/storage node etch. However, it is apparent from FIGS. 3 and 4 that the storage node polysilicon is bridged in the 3—3 and 4—4 regions forming deep filled polysilicon trenches 33 and 35 respectively, that are difficult to remove. The result is that it is difficult to ensure that after the storage node etch there is not any polysilicon filament remaining in these deep canyons that electrically bridges adjacent storage nodes.

Figure 5:
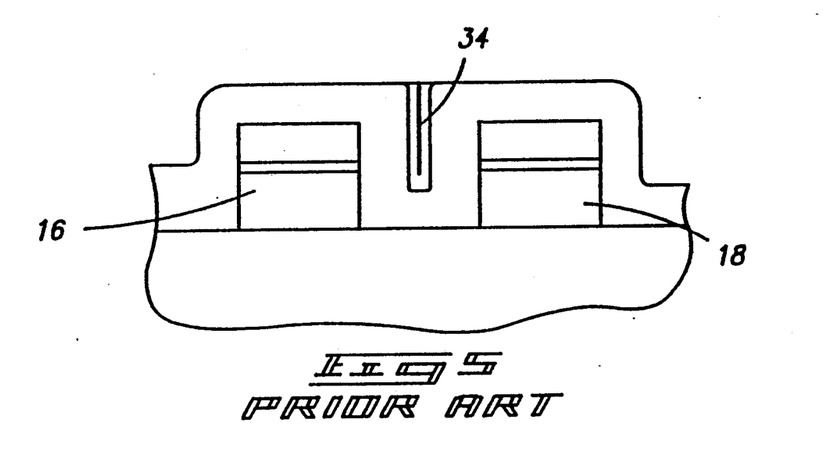
FIG. 5 is a cross sectional view of the FIG. 1 wafer as taken through line 3—3 in FIG. 1 at a prior art processing step subsequent to that shown by FIG. 3.

The problem created by failure to remove all bridging polysilicon can be seen by referring to FIGS. 1 and 5. FIG. 5 is a view corresponding to the FIG. 3 section taken subsequent to the polysilicon etch. As illustrated, a stringer region 34 remains after removal of polysilicon layer 30. This creates multiple stringer shorts between storage nodes, with one such short being shown by dashed lines 34 in FIG. 1.

It would be desirable to overcome these and other drawbacks associated with the prior art.

BRIEF DESCRIPTION OF THE DRAWINGS

Preferred embodiments of the invention are described below with reference to the accompanying drawings.

SUMMARY OF THE INVENTION

This disclosure of the invention is submitted in furtherance of the constitutional purposes of the U.S. Patent Laws "to promote the progress of science and useful arts" (Article 1, Section 8).

In accordance with one aspect of the invention, a semiconducting processing method of fabricating memory integrated circuitry having stacked capacitors comprises the following steps:

fabricating a semiconductor wafer to provide a pair of adjacent, substantially parallel and spaced word lines and to define regions for formation of stacked storage node capacitors and buried contacts therefor, the individual stacked capacitors overlapping the pair of adjacent word lines;

the pair of adjacent word lines including first separation regions therebetween within which storage node capacitors and respective buried contacts are provided, the pair of adjacent word lines including second separation regions therebetween, the first and second separation regions alternating relative to one another between and along the substantially parallel and separated word lines, the first separation regions having a first separation distance which defines the spacing between the pair of word lines in the first separation regions, the second separation regions having a second separation distance which defines the spacing between the pair of word lines in the second separation regions, the second separation distance being less than the first separation distance;

providing an insulating layer to a first selected thickness atop the wafer and between the pair of word lines, the first selected thickness being greater than one-half the second separation distance to fill the second separation regions between the pair of word lines with insulating material, the first selected thickness being less than one-half the first separation distance to provide a space within the first separation regions between the pair of word lines, the space having a width;

etching the insulating layer within the first separation regions to define buried contacts to underlying substrate;

depositing a layer of conductive material to a second selected thickness atop the wafer and within the space;

patterning the layer of conductive material to define lower storage node capacitor plates; and providing a capacitor dielectric and upper storage node capacitor plates above the lower storage node capacitor plates.

In accordance with another aspect of the invention, stacked capacitor memory integrated circuitry comprises:

a pair of adjacent, substantially parallel and spaced word lines;

a series of stacked capacitors formed between and along the pair of word lines, the capacitors having individual lower capacitor plates which overlap the pair of word lines;

the pair of adjacent word lines including first separation regions therebetween within which storage node capacitors and respective buried contacts are provided, the pair of adjacent word lines including second separation regions therebetween, the first and second separation regions alternating relative to one another between and along the substantially parallel and separated word lines, the first separation regions having a first separation distance which defines the spacing between the pair of word lines in the first sepatation regions, the second separation regions having a second separation distance which defines the spacing between the pair of word lines in the second separation regions, the second separation distance being less than the first separation distance;

an insulating material filling the second separation regions between the pair of word lines, buried contacts being provided to underlying substrate within the first separation regions;

lower capacitor plates filling the buried contacts; and capacitor dielectric atop the lower capacitor plates and upper storage node capacitor plates atop the capacitor dielectric.

DETAILED DESCRIPTION OF THE PREFERRED EMBODIMENT

Figure 6A:
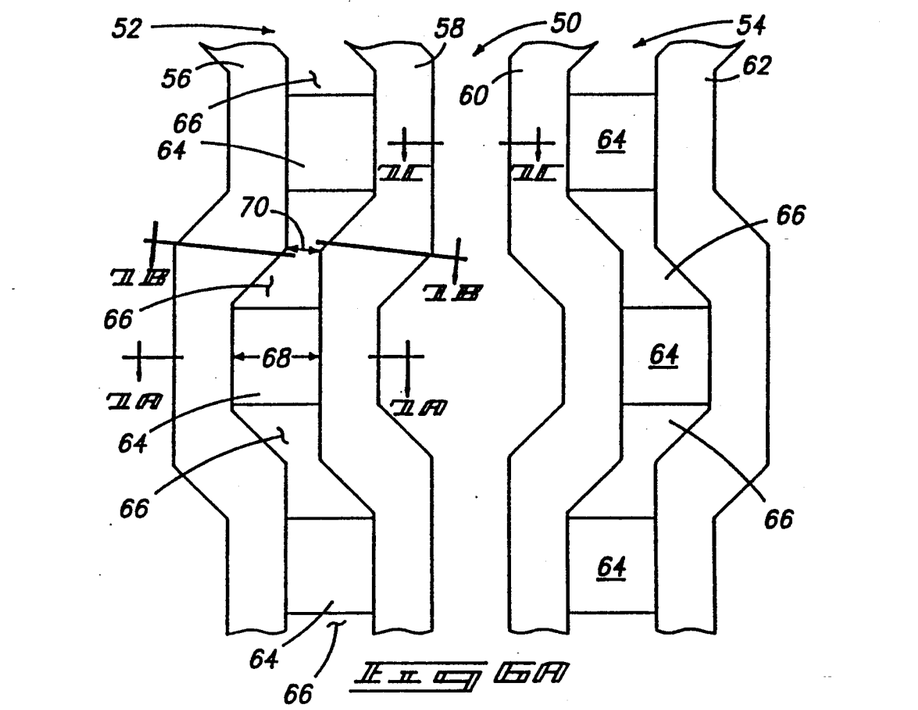
FIG. 6A is a plan view of a semiconductor wafer in accordance with the invention at one processing step in accordance with the invention.
Figure 7A:
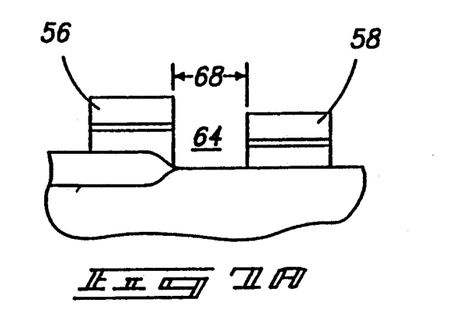
FIG. 7A is a sectional view taken through lines 7A—7A in FIG. 6A.
Figure 7B:
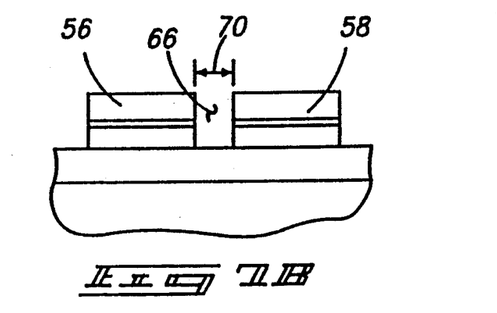
FIG. 7B is a sectional view taken through lines 7B—7B in FIG. 6A.

More specifically and with reference to FIG. 6A, a semiconductor wafer processed in accordance with the invention is indicated generally by reference numeral 50. A method of fabrication in accordance with the invention is described sequentially with references to FIGS. 6A–13B. Referring first to FIGS. 6A, 7A and 7B, semiconductor wafer 50 is fabricated to provide first and second pairs 52, 54 respectively, of word lines. Each pair 52, 54 comprises a adjacent, substantially parallel and spaced word lines. Specifically, pair 52 includes word lines 56, 58, while pair 54 includes word lines 60, 62. Word line pairs 52 and 54 are of a mirror image shape of each other. Such word lines are formed of gate oxide, conductor (polysilicon and $WSi_x$), and an overlying insulator material. The discussion and figures proceed with reference principally to word line pair 52, although corresponding constructions are provided with respect to word line pair 54.

Wafer 50 is fabricated to provide word lines 56, 58 and define regions for formation of stacked storage node capacitors and buried contacts therefor, with the individual stacked capacitors overlapping adjacent word lines 56 and 58, as will be more clear from the continuing discussion. Adjacent word lines 56, 58 include first separation regions 64 therebetween within which storage node capacitors and respective buried contacts will be provided. Word lines 56 and 58 include second separation regions 66, with regions 64 and 66 alternating relative to one another between and along substantially parallel word lines 56, 58. First separation regions 64 have a substantially constant first separation distance 68 (FIGS. 6A and 7A) which defines the minimum spacing between word lines 56 and 58 in first separation regions 64. Second separation regions 66 have a second separation distance 70 which defines the spacing between word lines 56 and 58 in second separation regions 66. As is apparent, second separation distance 70 is less than first separation distance 68.

Figure 8A:
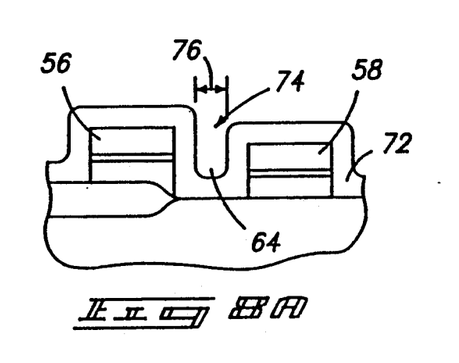
FIG. 8A is a sectional view positionally taken through lines 7A—7A in FIG. 6A at a processing step subsequent to that shown by FIGS. 7A and 7B.
Figure 8B:
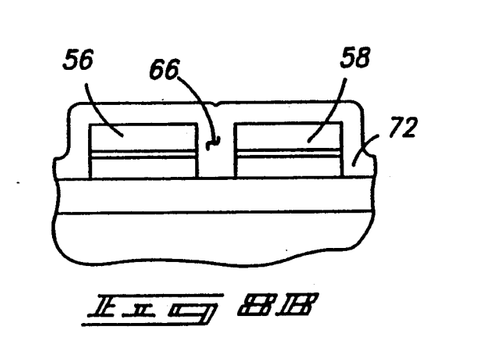
FIG. 8B is a sectional view positionally taken through lines 7B—7B in FIG. 6A at a processing step subsequent to that shown by FIGS. 7A and 7B.

Referring to FIGS. 8A and 8B, an insulating layer 72 is provided to a first selected thickness atop wafer 50 and between word lines 56 and 58. The first selected thickness is greater than one-half second separation distance 70 to fill second separation regions 66 between word lines 56 and 58 with insulating material, as shown. The first selected thickness is less than one-half first separation distance 68 to provide a space 74 within first separation region 64 between word lines 56 and 58. Space 74 has a width 76.

Figure 9A:
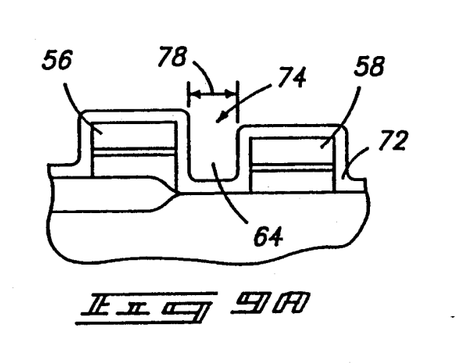
FIG. 9A is a sectional view positionally taken through lines 7A—7A in FIG. 6A at a processing step subsequent to that shown by FIGS. 8A and 8B.
Figure 9B:
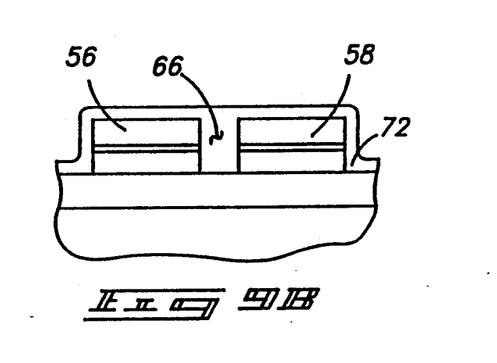
FIG. 9B is a sectional view positionally taken through lines 7B—7B in FIG. 6A at a processing step subsequent to that shown by FIGS. 8A and 8B.

Referring to FIGS. 9A and 9B, insulating layer 72 is isotropically etched, either by a wet or dry technique, to widen space 74 within first separation region 64 to enable maximizing capacitor area, as will be apparent from the continuing discussion. Such isotropic etch reduces the thickness of layer 72, as illustrated, and leaves a wider space 74 thickness 78.

Figure 6B:
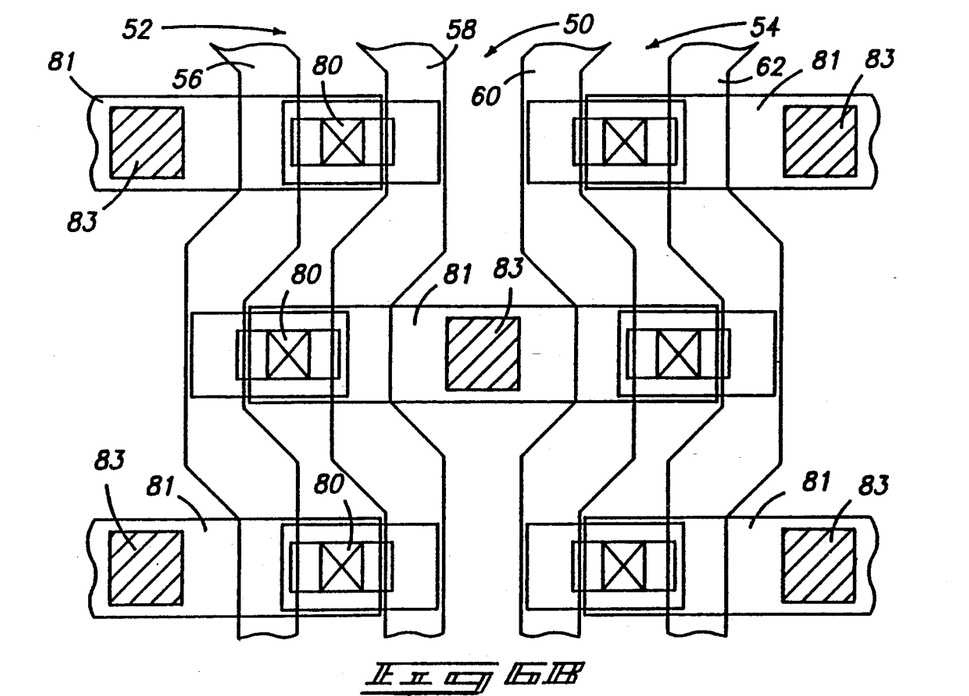
FIG. 6B is a plan view of a semiconductor wafer in accordance with the invention at a processing step in accordance with the invention subsequent to that shown by FIG. 6A.
Figure 10A:
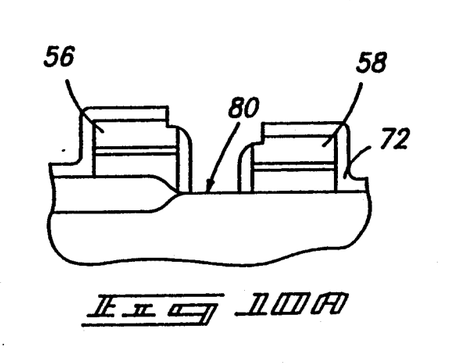
FIG. 10A is a sectional view positionally taken through lines 7A—7A in FIG. 6A at a processing step subsequent to that shown by FIGS. 9A and 9B.
Figure 10B:
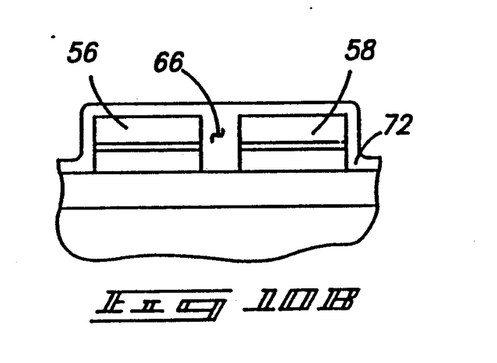
FIG. 10B is a sectional view positionally taken through lines 7B—7B in FIG. 6A at a processing step subsequent to that shown by FIGS. 9A and 9B.

Referring to FIGS. 6B, 10A and 10B, wafer 50 is selectively patterned and etched to define buried contacts 80 to underlying substrate. Active area outlines 81 and bit lines contacts 83 are shown in FIG. 6B.

Figure 11A:
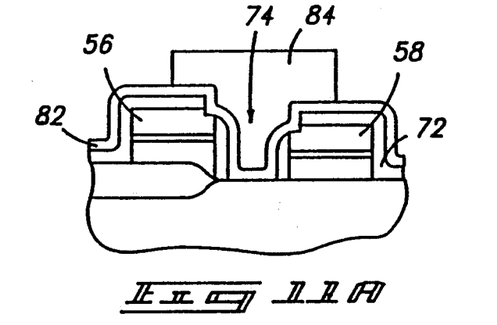
FIG. 11A is a sectional view positionally taken through lines 7A—7A in FIG. 6A at a processing step subsequent to that shown by FIGS. 10A and 10B.
Figure 11B:
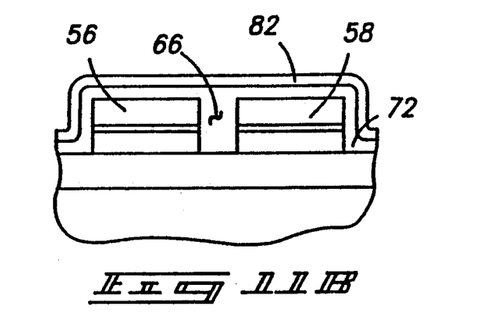
FIG. 11B is a sectional view positionally taken through lines 7B—7B in FIG. 6A at a processing step subsequent to that shown by FIGS. 10A and 10B.
Figure 11C:
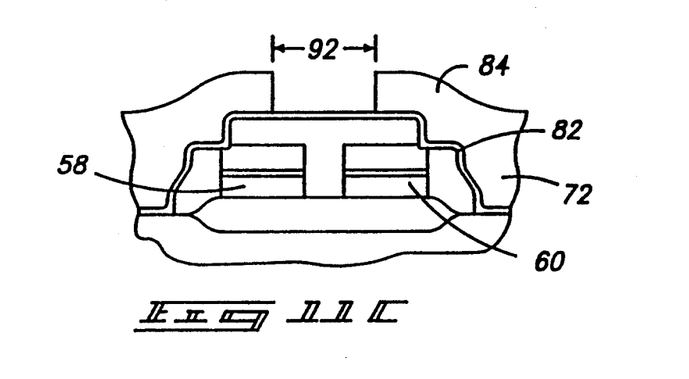
FIG. 11C is a sectional view positionally taken through lines 7C—7C in FIG. 6A at a processing step subsequent to that shown by FIGS. 10A and 10B.

Referring to FIGS. 11A, 11B and 11C, a layer 82 of conductive material (typically conductively doped polysilicon) is provided atop wafer 50 to a second selected thickness and within space 74 and fills buried contacts 80. The second selected thickness is less than half the widened space width 78 for maximizing available surface area for capacitance. Photoresist 84 is applied, exposed and removed as shown.

Figure 12A:
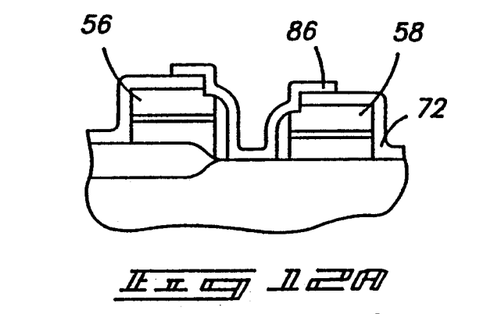
FIG. 12A is a sectional view positionally taken through lines 7A—7A in FIG. 6A at a processing step subsequent to that shown by FIGS. 11A, 11B and 11C.
Figure 12B:
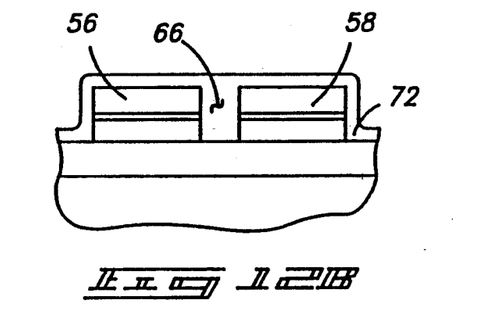
FIG. 12B is a sectional view positionally taken through lines 7B—7B in FIG. 6A at a processing step subsequent to that shown by FIGS. 11A, 11B and 11C.

Referring to FIGS. 12A and 12B, polysilicon layer 82 is patterned to define lower storage node capacitor plates 86.

Figure 13A:
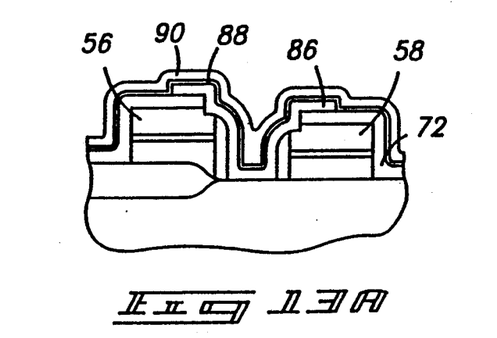
FIG. 13A is a sectional view positionally taken through lines 7A—7A in FIG. 6A at a processing step subsequent to that shown by FIGS. 12A and 12B.
Figure 13B:
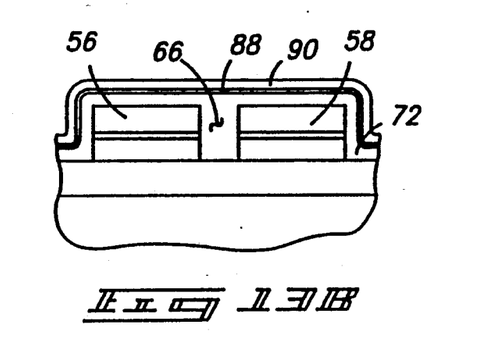
FIG. 13B is a sectional view positionally taken through lines 7B—7B in FIG. 6A at a processing step subsequent to that shown by FIGS. 12A and 12B.

Referring to FIGS. 13A and 13B, a common layer of capacitor cell dielectric 88 and upper storage node capacitor plate 90 are provided atop the wafer and above lower storage node capacitor plate 86 for definitions of stacked capacitors. Such produces a series of stacked capacitors formed between and along the pairs of word lines.

Referring particularly to FIGS. 6B and 11C, first and second pairs 52 and 54 of the word lines include a closest separation distance defined by numeral 92. Closest separation distance 92 is less than first separation distance 68, with the first selected thickness of oxide layer 72 being greater than one-half closest separation distance 92.

The above described embodiment provides word line gaps between areas for capacitor buried contacts of acceptable size for maximizing capacitance, while word line gaps between other areas of the word lines are adjusted downwardly to create regions between storage nodes that are filled with insulating material. This thereby avoids the stringer problems associated with the prior art. A more reliable and compact integrated circuit construction results.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. Integrated circuitry formed according to a method comprising the following steps:
   fabricating a semiconductor wafer to provide a pair of adjacent, substantially parallel and spaced word lines and to define regions for formation of stacked storage node capacitors and buried contacts therefor, the individual stacked capacitors overlapping the pair of adjacent word lines;
   the pair of adjacent word lines including first separation regions therebetween within which storage node capacitors and respective buried contacts are provided, the pair of adjacent word lines including second separation regions therebetween, the first and second separation regions alternating relative to one another between and along the substantially parallel and separated word lines, the first separation regions having a first separation distance which defines the spacing between the pair of word lines in the first separation regions, the second separation regions having a second separation distance which defines the spacing between the pair of word lines in the second separation regions, the second separation distance being less than the first separation distance;
   providing an insulating layer to a first selected thickness atop the wafer and between the pair of word lines, the first selected thickness being greater than one-half the second separation distance to fill the second separation regions between the pair of word lines with insulating material, the first selected thickness being less than one-half the first separation distance to provide a space within the first separation regions between the pair of word lines, the space having a width;
   selectively removing portions of the insulating layer within the first separation regions to define buried contacts to underlying substrate;
   depositing a layer of conductive material to a second selected thickness atop the wafer and within the space;
   patterning the layer of conductive material to define lower storage node capacitor plates; and
   providing a capacitor dielectric and upper storage node capacitor plates above the lower storage node capacitor plates.

2. Integrated circuitry formed according to the method of claim 1 wherein the selected thickness is less than half the space width.

3. Integrated circuitry formed according to the method of claim 1 wherein the method further comprises isotropically etching the insulating layer prior to buried contact etching to widen the space within the first separation region prior to deposition of the layer of conductive material.

4. Integrated circuitry formed according to the method of claim 1 wherein the pair of word lines recited in claim 1 define a first pair of word lines; and the method further comprises:
   fabricating the semiconductor wafer to provide a second pair of adjacent, substantially parallel and spaced word lines, the second pair of word lines being positioned adjacent the first pair of word lines, the second pair of word lines being mirror image in shape to the first pair of word lines; and
   the first and second pairs of word lines including a closest separation distance, the closest separation distance being less than the first separation distance, the first selected thickness being greater than one-half the closest separation distance.

5. Integrated circuitry formed according to the method of claim 1 wherein the second selected thickness is less than half the space width, and the method further comprises isotropically etching the insulating layer prior to buried contact etching to widen the space within the first separation region prior to deposition of the layer of conductive material.

6. Integrated circuitry formed according to the method of claim 1 wherein the second selected thickness is less than half the space width, and the pair of word lines recited in claim 1 define a first pair of word lines; and the method further comprises:

fabricating the semiconductor wafer to provide a second pair of adjacent, substantially parallel and spaced word lines, the second pair of word lines being positioned adjacent the first pair of word lines, the second pair of word lines being mirror image in shape to the first pair of word lines; and the first and second pairs of word lines including a closest separation distance, the closest separation distance being less than the first separation distance, the first selected thickness being greater than one-half the closest separation distance.

7. Integrated circuitry formed according to the method of claim 1 wherein the method further comprises isotropically etching the insulating layer prior to buried contact etching to widen the space within the first separation region prior to deposition of the layer of conductive material, and wherein the pair of word lines recited in claim 1 define a first pair of word lines; and the method further comprises:

fabricating the semiconductor wafer to provide a second pair of adjacent, substantially parallel and spaced word lines, the second pair of word lines being positioned adjacent the first pair of word lines, the second pair of word lines being mirror image in shape to the first pair of word lines; and the first and second pairs of word lines including a closest separation distance, the closest separation distance being less than the first separation distance, the first selected thickness being greater than one-half the closest separation distance.

8. Integrated circuitry formed according to the method of claim 1 wherein the second selected thickness is less than half the space width;

the method further comprising isotropically etching the insulating layer prior to buried contact etching to widen the space within the first separation region prior to deposition of the layer of conductive material, and wherein the pair of word lines recited in claim 1 define a first pair of word lines; and the method further comprising:

fabricating the semiconductor wafer to provide a second pair of adjacent, substantially parallel and spaced word lines, the second pair of word lines being positioned adjacent the first pair of word lines, the second pair of word lines being mirror image in shape to the first pair of word lines;

the first and second pairs of word lines including a closest separation distance, the closest separation distance being less than the first separation distance, the first selected thickness being greater than one-half the closest separation distance.

9. Stacked capacitor memory integrated circuitry comprising:

a pair of adjacent, substantially parallel and spaced word lines, the word lines having respective opposing outer edges and respective word line widths, respective word line width at given locations being defined by a straight line drawn normal to the opposing outer edges at the given locations, each word line of the pair having first and second regions of differing respective first and second widths alternating relative to one another along the substantially parallel and separated word lines; the first width being less than the second width;

a series of stacked capacitors formed between and along the pair of word lines, the capacitors having individual lower capacitor plates which overlap the pair of word lines;

the pair of adjacent word lines including first separation regions therebetween within which storage node capacitors and respective buried contacts are provided, the pair of adjacent word lines including second separation regions therebetween, the first and second separation regions alternating relative to one another between and along the substantially parallel and separated word lines, the first separation regions substantially corresponding in longitudinal position along the pair with the word line first width regions, the second separation regions substantially corresponding in longitudinal position along the pair with the word line second width regions, the first separation regions having a first separation distance which defines the spacing between the pair of word lines in the first separation regions, the second separation regions having a second separation distance which defines the spacing between the pair of word lines in the second separation regions, the second separation distance being less than the first separation distance;

an insulating material filling the second separation regions between the pair of word lines, buried contacts being provided to underlying substrate within the first separation regions;

lower capacitor plates filling the buried contacts; and capacitor dielectric atop the lower capacitor plates and upper storage node capacitor plates atop the capacitor dielectric.

10. The stacked capacitor memory integrated circuitry of claim 9 wherein the pair of word lines recited in claim 9 define a first pair of word lines; the stacked capacitor memory integrated circuitry further comprising:

a second pair of adjacent, substantially parallel and spaced word lines, the second pair of word lines being positioned adjacent the first pair of word lines, the second pair of word lines being mirror image in shape to the first pair of word lines;

the first and second pairs of word lines including a closest separation distance, the closest separation distance being less than the first separation distance, an insulating material filling between the first and second word line pairs along locations of closest separation.

11. Integrated circuitry formed according to a method comprising the following steps:

fabricating a semiconductor wafer to provide a pair of adjacent, substantially parallel and spaced word lines and to define regions for formation of stacked storage node capacitors and buried contacts therefor, the individual stacked capacitors overlapping the pair of adjacent word lines, the word lines having respective opposing outer edges and respective word line widths, respective word line width at given locations being defined by a straight line drawn normal to the opposing outer edges at the given locations, each word line of the pair having first and second regions of differing respective first and second widths alternating relative to one another along the substantially parallel and separated word lines; the first width being less than the second width;

the pair of adjacent word lines including first separation regions therebetween within which storage node capacitors and respective buried contacts are provided, the pair of adjacent word lines including second separation regions therebetween, the first and second separation regions alternating relative to one another between and along the substantially parallel and separated word lines, the first separation regions substantially corresponding in longitudinal position along the pair with the word line first width regions, the second separation regions substantially corresponding in longitudinal position along the pair with the word line second width regions, the first separation regions having a first separation distance which defines the spacing between the pair of word lines in the first separation regions, the second separation regions having a second separation distance which defines the spacing between the pair of word lines in the second separation regions, the second separation distance being less than the first separation distance;

providing an insulating layer to a first selected thickness atop the wafer and between the pair of word lines, the first selected thickness being greater than one-half the second separation distance to fill the second separation regions between the pair of word lines with insulating material, the first selected thickness being less than one-half the first separation distance to provide a space within the first separation regions between the pair of word lines, the space having a width;

selectively removing portions of the insulating layer within the first separation regions to define buried contacts to underlying substrate;

depositing a layer of conductive material to a second selected thickness atop the wafer and within the space;

patterning the layer of conductive material to define lower storage node capacitor plates; and providing a capacitor dielectric and upper storage node capacitor plates above the lower storage node capacitor plates.

12. Integrated circuitry formed according to the method of claim 11 wherein the selected thickness is less than half the space width.

13. Integrated circuitry formed according to the method of claim 11 wherein the method further comprises isotropically etching the insulating layer prior to buried contact etching to widen the space within the first separation region prior to deposition of the layer of conductive material.

14. Integrated circuitry formed according to the method of claim 11 wherein the pair of word lines recited in claim 11 define a first pair of word lines; and the method further comprises:

fabricating the semiconductor wafer to provide a second pair of adjacent, substantially parallel and spaced word lines, the second pair of word lines being positioned adjacent the first pair of word lines, the second pair of word lines being mirror image in shape to the first pair of word lines; and the first and second pairs of word lines including a closest separation distance, the closest separation distance being less than the first separation distance, the first selected thickness being greater than one-half the closest separation distance.

15. Integrated circuitry formed according to the method of claim 11 wherein the second selected thickness is less than half the space width, and the method further comprises isotropically etching the insulating layer prior to buried contact etching to widen the space within the first separation region prior to deposition of the layer of conductive material.

16. Integrated circuitry formed according to the method of claim 11 wherein the second selected thickness is less than half the space width, and the pair of word lines recited in claim 11 define a first pair of word lines; and the method further comprises:

fabricating the semiconductor wafer to provide a second pair of adjacent, substantially parallel and spaced word lines, the second pair of word lines being positioned adjacent the first pair of word lines, the second pair of word lines being mirror image in shape to the first pair of word lines; and the first and second pairs of word lines including a closest separation distance, the closest separation distance being less than the first separation distance, the first selected thickness being greater than one-half the closest separation distance.

17. Integrated circuitry formed according to the method of claim 11 wherein the method further comprises isotropically etching the insulating layer prior to buried contact etching to widen the space within the first separation region prior to deposition of the layer of conductive material, and wherein the pair of word lines recited in claim 11 define a first pair of word lines; and the method further comprises:

fabricating the semiconductor wafer to provide a second pair of adjacent, substantially parallel and spaced word lines, the second pair of word lines being positioned adjacent the first pair of word lines, the second pair of word lines being mirror image in shape to the first pair of word lines; and the first and second pairs of word lines including a closest separation distance, the closest separation distance being less than the first separation distance, the first selected thickness being greater than one-half the closest separation distance.

18. Integrated circuitry formed according to the method of claim 11 wherein the second selected thickness is less than half the space width;

the method further comprising isotropically etching the insulating layer prior to buried contact etching to widen the space within the first separation region prior to deposition of the layer of conductive material, and wherein the pair of word lines recited in claim 11 define a first pair of word lines; and the method further comprising:

fabricating the semiconductor wafer to provide a second pair of adjacent, substantially parallel and spaced word lines, the second pair of word lines being positioned adjacent the first pair of word lines, the second pair of word lines being mirror image in shape to the first pair of word lines;

the first and second pairs of word lines including a closest separation distance, the closest separation distance being less than the first separation distance, the first selected thickness being greater than one-half the closest separation distance.

* * * * *